(12) United States Patent
Gee et al.

(10) Patent No.: US 6,892,155 B2
(45) Date of Patent: May 10, 2005

(54) METHOD FOR THE RAPID ESTIMATION OF FIGURES OF MERIT FOR MULTIPLE DEVICES BASED ON NONLINEAR MODELING

(75) Inventors: Kevin Gee, Santa Rosa, CA (US); Nicholas B. Tufillaro, San Francisco, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 160 days.

(21) Appl. No.: 10/299,169

(22) Filed: Nov. 19, 2002

(65) Prior Publication Data

US 2004/0098215 A1 May 20, 2004

(51) Int. Cl.⁷ .......................... G01D 3/00; G01M 19/00

(52) U.S. Cl. .......................................... 702/108; 703/2

(58) Field of Search ............................. 702/108, 117, 702/109, 118, 127; 703/2, 13–18

(56) References Cited

U.S. PATENT DOCUMENTS

| 6,000,833 | A | 12/1999 | Gershenfeld et al. | |
|---|---|---|---|---|
| 6,285,971 | B1 | * 9/2001 | Shah et al. | 703/2 |
| 6,374,204 | B1 | * 4/2002 | Mandell et al. | 703/14 |
| 6,675,137 | B1 | * 1/2004 | Toprac et al. | 703/2 |
| 2002/0072872 | A1 | 6/2002 | Chatterjee et al. | |
| 2004/0002844 | A1 | * 1/2004 | Jess et al. | 703/14 |

FOREIGN PATENT DOCUMENTS

EP  1 128 293  8/2001

OTHER PUBLICATIONS

U.S. Appl. No. 09/420,607, Barford et al.
U.S. Appl. No. 09/511,930, Tufillaro et al.
"Understanding CDMA Measurements for Base Stations and Their Components," Agilent AN 1311, (Jun. 2000), pp. 1–36.
Testing and Troubleshooting Digital RF Communications Receiver Designs, Agilent AN 1314, Mar. 25, 2002, pp. 1–24.
"Third Order Intermodulation Distortion Measurements: A Downloadable Procedure for Agilent 8566B and 8568 Spectrum Analyzers," Agilent Technologies, Inc., (Oct. 2000), pp. 1–6.
"Agilent PSA Series Spectrum Analyzers," Agilent Technologies, Inc., (Jun. 4, 2002), pp. 1–20.
"Measuring Bit Error Rate Using the ESG–D Series RF Signal Generators, Option UN7," Agilent Technologies, Inc., (Dec. 8, 2000), pp. 1–8.
"Agilent PSA Series Spectrum Analyzers Data Sheet," Aglient Technologies, Inc., (May 24, 2002), pp. 1–16.
Barnard, Jakobus P., "Embedding of Multidimensional Time–Dependent Observations," Physical Review E., vol. 64, 046201, (2001), pp. 1–4.

(Continued)

Primary Examiner—John Barlow
Assistant Examiner—Demetrius Pretlow

(57) ABSTRACT

A system and a general method estimate figures of merit based on nonlinear modeling and nonlinear time series analysis. Terms in a nonlinear behavioral model that depend on nonlinear combinations of a fixed input signal value are precomputed, optimizing the behavioral model such that figures of merit are evaluated from a single short stimulus vector. The optimized nonlinear behavioral model can then be applied to evaluate figures of merit for multiple devices under test (DUTs) in a manufacturing line. A process continually verifies and adjusts the nonlinear behavioral model based on sub-sampling multiple DUTs in a manufacturing line and comparing their figures of merit based on nonlinear modeling with those based on conventional measurement procedures.

20 Claims, 2 Drawing Sheets

OTHER PUBLICATIONS

Boccaletti, S., et al., "Reconstructing Embedding Spaces of Coupled Dynamical Systems from Multivariate Data," Physical Review E, vol. 65, 035204(R), (2002), pp. 1–4.

Gregorcic, Gregor, "Singular Value Decomposition—SVD," University College Cork, Ireland, (Aug. 1, 2001), pp. 1–7.

Usikov, Daniel, "Behavioral Modeling of Nonlinear Systems," (Aug. 10, 1999), pp. 1–73.

Voelker, "Apply Error Vector Measurements in Communications Design," Microwaves & RF, pp. 143–149, (Dec. 1995).

Gershenfeld, Neil, "The Nature of Mathematical Modeling," Cambridge University Press, Cambridge, UK (1999), pp. 115–127, 139–155, 204–213, 220–224.

Kantz, Hogler et al., "Nonlinear Time Series Analysis," Cambridge University Press, 1997, Table of Contents only.

Kay, Steven M., "Modern Spectral Estimation: Theory and Application," Prentice Hall, Upper Saddle River, New Jersey, 1988, Table of Contents only.

Lathi, B.P., "Linear Systems and Signals," Oxford University Press Inc., 2002, Table of Contents only.

"Pseudoinverse," Web page, obtained from, http://ikep1101.ikp.kfa–juelich.de/briefbook_data_analysis/node220.html, dated Oct. 1, 2002, 1 page.

"The Pseudo Inverse," Web page, obtained from, http://www.imm.dtu.dk/mj/MScProject/node18.html, dated Oct. 1, 2002, 1 page.

Hanselman, Duane et al., "Mastering Metlab 6," Prentice Hall, Inc., 2001, Upper Saddle River, New Jersey, Table of Contents only.

* cited by examiner

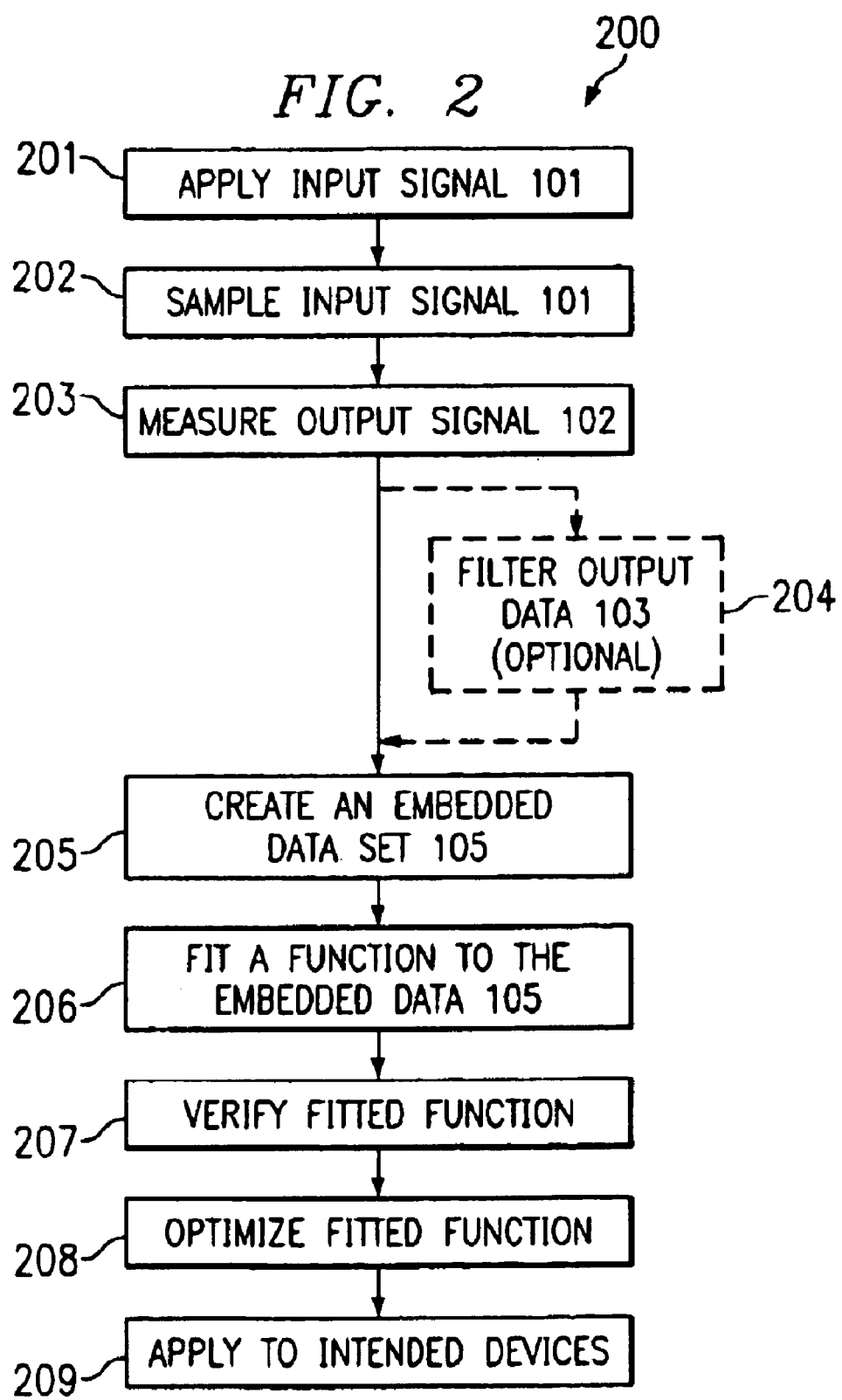

METHOD FOR THE RAPID ESTIMATION OF FIGURES OF MERIT FOR MULTIPLE DEVICES BASED ON NONLINEAR MODELING

CROSS-REFERENCE TO RELATED APPLICATIONS

This application is related to co-pending and commonly assigned U.S. patent application Ser. No. 09/420,607 filed Oct. 18, 1999, entitled "METHOD AND APPARATUS FOR EXTRACTION OF NONLINEAR BLACK BOX BEHAVIORAL MODELS FROM EMBEDDINGS OF TIME-DOMAIN MEASUREMENTS," hereinafter referred to as U.S. application Ser. No. 09/420,607; and U.S. patent application Ser. No. 09/511,930 filed Feb. 23, 2000 and published Aug. 29, 2001 as document EP 1,128,293, entitled "EXCITATION SIGNAL AND RADIAL BASIS FUNCTION METHOD FOR USE IN EXTRACTION OF NONLINEAR BLACK-BOX BEHAVIORAL MODELS FROM EMBEDDINGS OF TIME-DOMAIN MEASUREMENTS," hereinafter referred to as EP 1,128,293; the disclosures of which are hereby incorporated herein by reference.

TECHNICAL FIELD

This invention relates to nonlinear mathematical modeling and particularly to a method for the rapid estimation of figures of merit for multiple devices under test based on nonlinear modeling.

BACKGROUND OF THE INVENTION

One common use of instrumentation in a manufacturing environment is to determine rapidly "figures of merit" of a manufactured electronic component or system. Such figures of merit are used both to determine the quality of component or system, and also to enable the component or system to be optimized relative to its performance specification.

For example, in the manufacture of amplifiers for wireless base stations, nonlinear figures of merit such as third-order intercept are typically used in the tuning process, and figures of merit such as the adjacent channel power ratio are used to check final compliance of an amplifier with federally mandated specifications. In the design of an entire wireless base station on the other hand, the error-vector-magnitude is monitored across different sub-components of the base station in an attempt to optimize the overall bit error rate (BER) or correlation coefficient ($\rho$) of the transmitter. Thus, various figures of merit come into play in developing and manufacturing a component or system, and how they are used depends on a mix of issues both practical and legal.

Typical figures of merit that play a key role in the manufacturing and testing of radio frequency (RF) and microwave components and systems are so-called:

Correlation Coefficient ($\rho$),

Error Vector Magnitude (EVM),

Adjacent Channel Power Ratio (ACPR), and

Third-Order Intermodulation Distortion (IMD).

The first two of the above figures of merit, $\rho$ and EVM, defined in terms of time domain signals (see for example Testing and Troubleshooting Digital RF Communication Receiver Designs, Agilent Application Note AN 1314, pp. 1–24, Mar. 25, 2002), attempt to summarize the distortion produced by a system in terms of an average difference in the time domain between the specified and observed behavior of a stimulus and response signal. The latter two figures of merit, ACPR (see for example Understanding CDMA Measurements for Base Stations and Their Components, Agilent Application Note AN 1311, pp. 1–36, June 2000) and IMD (see for example Third Order Intermodulation Distortion Measurements, Agilent Product Note PN 8566B/8568B-1, 5954-2701, pp. 1–6, October 2000), are defined in the frequency domain, and are quantities which can be computed from a power spectral density (PSD) function using a fast Fourier transform (FFT). However, all four figures of merit are estimated in prior art instrumentation through a stimulus and response measurement on each device under test (DUT), which uses no prior information about the DUT. Moreover, each figure of merit is computed by an independent stimulus and response measurement, even on the same DUT. The advantage of this prior art approach is that the instrument is able to provide information about a large range of different types of devices or systems, since the algorithms used to compute the relevant figure of merit do not depend on the type of DUT. A drawback, however, is that a great deal of data and thus of measurement time is required to accurately estimate a single figure of merit for a single DUT.

BRIEF SUMMARY OF THE INVENTION

The present invention is directed to a system and a general method which estimate figures of merit based on nonlinear modeling and nonlinear time series analysis. According to embodiments of the invention, terms in a nonlinear behavioral model that depend on nonlinear combinations of a fixed input signal value are precomputed, optimizing the behavioral model such that figures of merit are evaluated from a single short stimulus vector. The optimized nonlinear behavioral model can then be applied to evaluate figures of merit for multiple devices under test (DUTs) in a manufacturing line. According to some embodiments, a process continually verifies and adjusts the nonlinear behavioral model based on sub-sampling multiple DUTs in a manufacturing line and comparing their figures of merit based on nonlinear modeling with those based on conventional measurement procedures.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 2 is a flow diagram depicting a method, according to embodiments of the invention, for producing a behavioral model of a nonlinear device from embeddings of time-domain measurements.

DETAILED DESCRIPTION OF THE INVENTION

Figure 1:
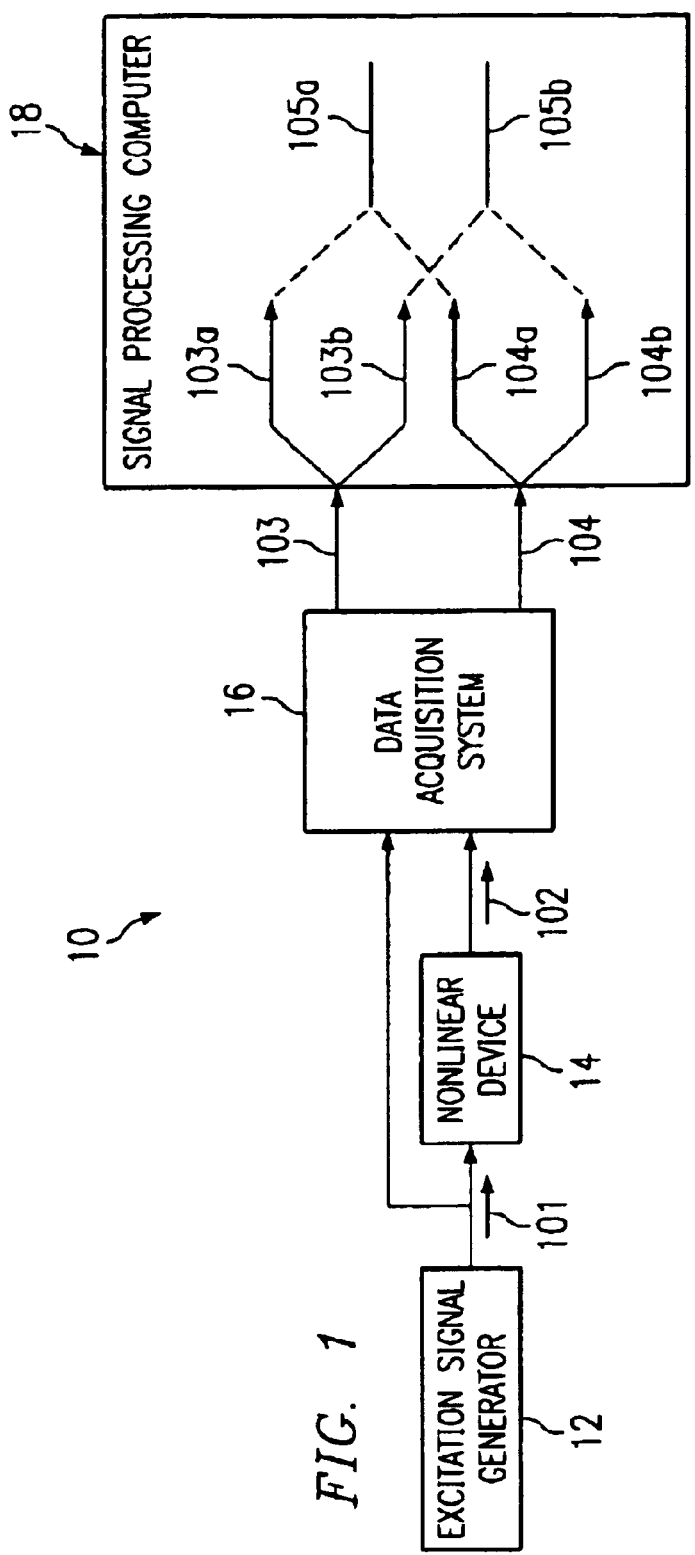
FIG. 1 is a block diagram depicting apparatus in accordance with embodiments of the present invention.

The present invention is directed to a system and method that use prior knowledge about a DUT to dramatically reduce the data needed to accurately estimate a figure of merit. This prior knowledge can be used to increase the resolution of a measurement or to reduce the data quantity needed to make an estimate to a given resolution, or both. This fact has been appreciated by those doing spectral estimation, where "prior knowledge" is typically expressed as a parametric model for the DUT. Parametric spectral estimation is a well-developed technique both theoretically and practically (see for example Kay, Modern Spectral Estimation—Theory and Application, Prentice-Hall, 1988), and the dramatic advantages in terms of resolution and/or speed to be gained by having an accurate model when trying to identify the behavior of a DUT are well documented. However, parametric spectral estimators depend on an accurate prior model for the DUT before such advantages can be realized. Moreover, most parametric spectral estimation methods deal with linear signals and systems (see for example Lathi, Linear Systems and Signals, Oxford University Press, Chapter 13, 2002), and figures of merit typically are focused on capturing relatively small deviations from linearity, that is, the nonlinear behavior of a component or system. Further, both the construction and use of such models with current instrumentation raises problematic issues for both theory (how to construct accurate nonlinear models rapidly) and implementation (how to enable instruments to easily handle different algorithms for different DUTs). The present invention is directed to the first of these problems, namely how to rapidly build an accurate nonlinear model and from it efficiently estimate relevant figures of merit.

DUTs from a development phase and from sub-samples of an entire manufacturing line are used to build a nonlinear "black box" model for the DUT's time domain response. After this model is developed, a short stimulus and response measurement in the time-domain is used to fit any individual DUT to a precomputed nonlinear model structure. Particular model structures described herein are nonlinear, but are linear-in-parameters.

Instrumentation embodying these capabilities is particularly attractive in manufacturing environments, where the cost associated with the time duration of a test is paramount. A large number of tests are typically performed on DUTs all similar except for process variations. Unlike a more general-purpose instrument needed in a research and development lab, a dedicated instrument used in manufacturing test environment performs the same measurements repeatedly on very similar devices. In such a situation, it would be advantageous to make use of a model for the DUT constructed from a subset of the DUTs to be characterized, and then use this model to improve or shorten the overall test time for all DUTs on a manufacturing line.

The present invention is directed to a general method to do this, when the DUT has significant nonlinear behavior or must meet stringent linearity requirements that need to be modeled and quantified by its associated figures of merit.

Generally, methods for such nonlinear modeling are extensions of nonlinear time series analysis useful to estimate figures of merit that can be derived from PSD, which are described for other implementations in co-pending and commonly assigned U.S. application Ser. No. 09/420,607, and EP 1,128,293, cited above, the disclosures of which have been incorporated herein by reference. An embodiment of these methods is documented specifically to model and compute figures of merit for HP power amplifier configured to operate from 1–50 Ghz, subject to an excitation signal such as CDMA 2000 from a signal source generator model ESG E4432B (see Measuring Bit Error Rate Using the ESG-D Series RF Signal Generators. Agilent Product Note 5966-4098E, pp. 1–8, Dec. 8, 2000). The response is measured with a high performance spectrum analyzer, for example Agilent model PSA E4440A with time domain capture option B7J digital modulation hardware required for cellular communications measurement personalities (see Agilent Product Note 5966-4098E cited above). A Matlab script has been developed for the above embodiment (see Hanselman et al., Mastering Matlab 6, Prentice-Hall, 2000).

Embodiments of the present invention utilize time-domain measurements of a nonlinear device to produce or extract a "black box" behavioral model of the device from embeddings of these measurements. The methods of the present invention are applicable to modeling devices, where information about the device is provided by either physical measurements or simulated measurements.

The use of embeddings to extract models from time domain measurements of nonlinear devices is called non-linear time series analysis (NLTSA). The term "black box" as used herein refers to a model that requires little or no detailed information of the device, for example topology of an equivalent circuit or knowledge of underlying physics, be known before the model is constructed. The term "embedding" as used herein refers to a function or mapping from a set U to a new set W, where typically W has a dimension greater than U but not more than twice the dimension of U. Typically the embedding vector is calculated by the well-documented method of time-delays (see for example Kantz et al., Nonlinear Time Series Analysis, Cambridge University Press, Section 3.3, pp. 34–36, 1997). Since the device contains an input/output system, the normal method of time delays is augmented as follows: (i) compute the mutual information of a possible vector of output signals, for example a two-dimensional vector representing the I and Q channels of a modulated signal, and take a time delay for all input/output signals equal to the smallest value of the first minimum of the mutual information of all the output signal, (ii) then compute the false nearest neighbor statistics of all combinations of input and output vectors up to a fixed number of delays, typically not more than three; (iii) this typically provides more than one set of candidate embedding vectors, from which is selected the candidate set having the fewest number of delayed response variables in the embedding vector. If a nearest neighbor statistic yields a model with no response embedding variables, then the resulting model from this embedding variable is called "static." Otherwise, the model needs to contain memory effects and is called "dynamic." Recent publications describe in more detail this method to select embedding variables for an input/output system (see for example Barnard et al., Physical Review E, V.64, 046201, 2001; Boccaletti et al., Physical Review E, V.65, 035204-1, 2002).

The method described above in accordance with the present invention differs from the method disclosed in co-pending applications Ser. No. 09/420,607, and EP 1,128, 293, cited above, the disclosures of which have been incorporated herein by reference, in that the input signal illustrated above is a specific type common to cell phone modulation schemes such as of CDMA or GSM and is completely specified by the instrument generating the signal source, for example Agilent E4432B or E4438C (see Agilent Product Note 5966-4098E, cited above).

This input or drive signal is typically referred to as a stimulus signal and is measured in the time domain. The output, typically called a response signal of the DUT, is also measured in the time domain with an instrument, for example Agilent E4440A Performance Spectrum Analyzer (see Agilent Product Note 5966-4098E, cited above). The first step of the method consists of time-aligning the stimulus and response signals. This is typically done by maximizing the cross-correlation function of the stimulus and response functions, though much more sophisticated methods can be applied leading to time alignment of far greater accuracy. Once the stimulus and response signals are time aligned, the embedding vector is created as described above.

Embedding methods include, but are not limited to, so called "lagged" embeddings, embeddings using singular value decomposition (SVD) of the data, wavelet embeddings, and combinations thereof. The embedding types differ according to the specific functions that are used.

The next step of the method seeks to fit a function $G(\cdot)$ from the embedded data set to the corresponding output data. In general, the function $G(\cdot)$ is a function of the embedded data set to one component of the output, usually denoted y(t), while the input data set is usually denoted by u(t). The dimension of the embedded input is denoted by l and is the number of lagged data samples taken from the first output data subset, m is the number of lagged data samples taken from the first input data subset and $\tau$ is a multiple of a time between samples $\Delta t(\tau=k\Delta t)$, also called a "lag". The sample interval or sample time $\Delta t$ corresponds to the above described discrete time interval used in the sampling step and the measuring step. In the specific case of a lag embedding, the function $G(\cdot)$ is of the form $y(t+1)=G(y(t),y(t-\tau), \ldots, y(t-l\tau), u(t-\tau), \ldots, u(t-m\tau))$. $G(\cdot)$ for other embedding types would be readily apparent to one skilled in the art (see for example co-pending applications Ser. No. 09/420,607, and EP 1,128,293, cited above, the disclosures of which have been incorporated herein by reference).

The next step, called fitting, includes the steps of determining the function $G(\cdot)$, and after selecting the structural parameters ($\tau$, l and m in the lagged embedding case) and/or other parameters of function $G(\cdot)$. For example, other parameters may include polynomial coefficients in the case of a polynomial form of the function $G(\cdot)$. The step of fitting is often called model estimation or training and is well known to those skilled in the art. Likewise, when other embeddings are used, one skilled in the art would readily recognize an alternative form from those here that would be applicable in addition to the structural parameters involved.

A verification step, usually called out-of-sample model validation, checks the fitted function $G(\cdot)$ using a second subset of the input data and the output data. Further steps are directed to intended use of the model. A further step includes using the model to analytically or computationally optimize the calculation of figures of merit from a single stimulus signal. This optimization process can be accomplished as follows: In models that are nonlinear, but are linear-in-parameters, all nonlinear model terms that depend on non-linear combinations of the stimulus signals can be precomputed before the model is used. For instance, in computing ACPR, first the PSD function needs to be computed. However, each term in the Fourier transform of each term in the nonlinear "black box" time domain model can be pre-computed beforehand and stored in memory, for example within a measuring or computational instrument, such that the process of estimating PSD or ACPR simply reduces to a least square fit of parameters of the pre-computed model structure.

FIG. 1 is a block diagram depicting apparatus 10 in accordance with embodiments of the present invention. In accordance with the embodiments, apparatus 10 for producing a behavioral model of a nonlinear device from embeddings of time-domain measurements includes excitation signal generator 12 that produces input signal (or excitation signal) 101. Excitation signal generator 12 can be a digital-to-analog converter (DAC), an arbitrary waveform generator (AWG), or a set of sine wave generators with amplitude and phase weighted outputs. Sine wave generators are especially useful at high frequencies (e.g., RF and above), where DACs and AWGs are difficult to find or do not exist. Those skilled in the art will recognize that there are other means for implementing excitation signal generator 12 besides those listed above, all of which are within the scope of the invention.

Input signal 101 is applied to an input port of nonlinear device under test (DUT) 14, which produces output response signal 102 at an output port of nonlinear device 14. Although input signal 101 can be any time-domain signal or combination of signals, preferably input signal 101 is constructed in a manner that insures adequate coverage of the operational range of nonlinear device 14 both in terms of amplitude and of frequency The specifics of the construction of input signal 101 are described further in co-pending applications Ser. No. 09/420,607, and EP 1,128,293, cited above, the disclosures of which have been incorporated herein by reference.

Apparatus 10 of the embodiment further incorporates data acquisition system 16, which samples and digitizes input signal 101 and output signal 102 to produce input data 104 and output data 103, respectively. Output data 103 represents a measured response of device 14 to input signal 101. Data acquisition system 16 can be constructed using either analog-to-digital converters (ADCs) or using traditional frequency-domain or time-domain measurement systems. Examples of traditional frequency-domain measurement equipment include vector network analyzers or microwave transition analyzers with absolute power and phase calibration and software for reconstructing time-domain voltage and current waveforms from frequency-domain measurements. This approach of frequency-domain measurement is generally required at high frequencies such as RF and above, where it is costly or impossible to measure voltages and currents directly with ADCs. Those skilled in the art will recognize that there are other applicable means for sampling and producing input data 104 and output data 103 for a given application of apparatus 10, all of which are within the scope of the present invention.

Apparatus 10 of the embodiment further includes signal processing computer (or signal processor) 18. Input data 104 and output data 103 produced by data acquisition system 16 are further processed by signal processing computer 18. First, signal processing computer 18 separates input data 104 and output data 103 into first and second subsets designated 104a, 104b, and 103a, 103b, respectively. Second, signal processor 18 utilizes first subset 104a of input data 104 and first subset 103a of output data 103 to construct an embedding space. Third, signal processing computer 18 embeds first subsets 104a and 103a in the embedding space as a first embedded data set designated 105a. Fourth, signal processing computer 18 fits a function to the first embedded data set 105a in the embedding space. Then signal processing computer 18 verifies the fitted function using the second subset 104b of input data 104 and second subset 103b of output data 103. The verified fitted function G(·) is the behavioral model of nonlinear device 14. In another embodiment, signal processing computer 18 further computes a continuous-time model from the discrete behavioral model produced by the fitted function G(·).

Embodiments of the present invention advantageously fit the function G(·) to the first embedded data set 105a using standard nonlinear modeling methods, such as neural networks, radial basis functions, or global polynomials. Therefore, the larger problem of input/output behavioral modeling is reduced according to the present invention to a number of smaller sub-problems, namely (1) the design of appropriate excitation signals; (2) the determination of the function G(·) and its structural parameters; (3) the determination of model parameters implicit in the fitted function G(·) such as coefficients in the model class, for example polynomial coefficients if the fitted function G(·) is polynomial; and (4) model or fitted function validation. Although in practice, the approach to solving these sub-problems may depend strongly on the particular device being modeled, a general approach methodology for solving the sub-problems (1)–(4) is illustrated in steps 201–207 of method 200 depicted in FIG. 2, using apparatus 10 to represent all applicable devices.

FIG. 2 is a flow diagram depicting method 200 according to embodiments of the invention, for producing a behavioral model of a nonlinear device from embeddings of time-domain measurements. Method 200 is an iterative process starting at step 201 with applying input signal 101 generated by excitation signal generator 12 to nonlinear device 14. Input signal 101 can be any time-domain or frequency domain signal or combination of signals. In general, the selection or construction of input signal 101 can be iterative and dependent on particular characteristics of nonlinear device 14, such as operational frequency range and peak voltage levels. The construction of input signal 101, also referred to herein as an excitation signal, is further described in co-pending applications Ser. No. 09/420,607, and EP 1,128,293, cited above, the disclosures of which have been incorporated herein by reference.

Method 200 further includes sampling at step 202 input signal 101 in data acquisition system 16 to produce input data 104. Input signal 101 is sampled at discrete time intervals during step 201 of applying as further described in co-pending applications Ser. No. 09/420,607, and EP 1,128,293, cited above, the disclosures of which have been incorporated herein by reference. In some embodiments, the time intervals are fixed according to standard engineering practice, and input data 104 is stored as an array of signal processing values in memory of computer 18.

Method 200 further includes at step 203 measuring output signal 102 in response to input signal 101 at an output port of nonlinear device 14 to produce output data 103 corresponding to input data 104. The response is measured at discrete time intervals, and output data 103 represents a time-series of response signal 102. In some embodiments, response signal 102 is measured at substantially the same discrete time intervals as used at step 202 for sampling input signal 101, and output data 103 is stored as a separate array or set of values in memory of computer 18.

In some embodiments, step 203 of measuring is followed by step 204 of filtering output data 103. Filtering step 204 is used to reduce the noise content of output data 103. Noise is corruption of the data that may be introduced during step 203 of measuring and is well known to those skilled in the art. Filtering step 204 may be accomplished using either linear or nonlinear filtering techniques. Preferably, output data 103 is filtered using one of several nonlinear filtering techniques known in the art and further described in co-pending applications Ser. No. 09/420,607, and EP 1,128, 293, cited above, the disclosures of which have been incorporated herein by reference.

Method 200 further includes step 205 of creating an embedded data set designated 105 in processing computer 18 using a first subset 104a of input data 104 and a first subset 103a of output data 103. Step 205 of creating an embedded data set is further described in co-pending applications Ser. No. 09/420,607, and EP 1,128,293, cited above, the disclosures of which have been incorporated herein by reference.

In some embodiments, first subset 104a of input data 104 and first subset 103a of output data 103 contain less data than the total data produced for each. The remaining portions of input data 104 and output data 103 not included in the first respective subsets are used at verification step 207 described below and are referred to as second subset 104b of input data 104 and second subset 103b of output data 103 respectively. In an another embodiment, first subsets 104a', 103a' include all of the available data, and therefore additional data for use in verification step 207 are generated for second subsets 104b', 103b' after step 205 of creating embedded data set 105. Step 205 of creating embedded data set 105, in particular determining of the embedding type and the embedding dimension, is further described in co-pending applications Ser. No. 09/420,607, and EP 1,128,293, cited above, the disclosures of which have been incorporated herein by reference.

Method 200 further includes step 206 of fitting function G(·) from embedded data set 105 to corresponding output data 103. In general, G(·) is a function of the embedded data set 105 created at embedding step 205 as further described in co-pending applications Ser. No. 09/420,607, and EP 1,128,293, cited above, the disclosures of which have been incorporated herein by reference.

There are a number of techniques for performing the step of fitting 206 that are generally applicable to a wide variety of embedding types. The techniques include, but are not limited to: (i) least-squares fitting with multivariate polynomials, (ii) fitting using other appropriate basis functions, such as radial basis functions, (iii) fitting using a neural network as a universal function approximator, and (iv) fitting with local linear models (see for example Kantz et al., Nonlinear Time Series Analysis, Cambridge University Press, 1997, cited above). In addition, many other techniques for fitting a function to data may be used in conjunction with the present invention. There may be advantages of using one of these techniques over others in specific practical situations. Such advantages and the appropriate choice of the function fitting method given a particular embedding will be apparent to those skilled in the art and are all within the scope of the present invention.

Method 200 further includes at step 207 verifying the fitted function G(·) using second subset 104b, 103b of input data 104 and output data 103. Verifying step 207 includes a sub-step of using second subset 104b of input data 104 to produce a second embedded data set designated 105b. Verifying step 207 further includes a sub-step of using first embedded data subset 105a and second embedded data subset 105b in the fitted function G(·) to produce a first predicted data and a second predicted data, respectively. Verifying step 207 further includes a sub-step of comparing the second predicted data from the function G(·) with the second subset 103b of output data. The objective of the sub-step of comparing is to determine if the predicted data are sufficiently similar to second subject 103b of output data 103 from nonlinear device 14. Whether the predicted data and second subset 103b of output data 103 are sufficiently similar will depend on the particular application and will be apparent to those skilled in the art. If the second predicted data and second subset 103b of output data 103 are sufficiently similar, then the fitted function G(·) accurately mimics (or is said to accurately model or predict) the performance of the device. The verified fitted function G(·) then becomes the behavioral model of nonlinear device 14 in a discrete time representation.

A first test that can be used at step 207 to verify the function G(·) is based on the root-mean-squared (RMS) error of the predicted data relative to input signal power. As a rule of thumb, the RMS error of the predicted data usually should be 1–10% of the signal power of input data 104. In this test, the RMS error of the first predicted data is compared to the power of first subset 104a of input data 104a. Likewise, the RMS error second predicted data is compared to the power of second subset 104b of input data 104. If the RMS error is greater than 10% of the signal power in either the first or second subset case, then the model is likely to be "underfitted," and the verification is considered to have failed.

In a second test, the performance of fitted function G(·) is compared between the first and second embedded data sets. As a rule of thumb, the fitted function is said to accurately model or predict the performance of the device if the RMS error associated with the second predicted data is less than or equal to three times the RMS error associated with a first predicted data utilizing training data as described in more detail in co-pending applications Ser. No. 09/420,607, and EP 1,128,293, cited above, the disclosures of which have been incorporated herein by reference. Generally, if the RMS error associated with the second predicted data is less than the RMS error associated with the first predicted data, then the model is not considered validated. In fact, in most cases this condition indicates that the model is likely to be "overfitted".

The RMS error as used herein is the RMS difference between the predicted output data given by G(·) and the corresponding portion of measured output data 103. The RMS error associated with the first predicted data is the RMS difference between a predicted output using first embedded data set 105a as an input to G(·) and first subset 103a of output data 103. The RMS error associated with the second predicted data is the RMS difference between the predicted data produced using second embedded data set 105b as an input to G(·) and second subset 103b of output data 103. The first predicted data is produced by applying the fitted function G(·) to first embedded data set 105a. Those skilled in the art will recognize that there are numerous other criteria for verifying the fitted function G(·) in specific cases all of which are within the scope of the invention.

At step 208 an optimization process is performed in models that are nonlinear, but are linear-in-parameters, such that all nonlinear model terms that depend on nonlinear combinations of the stimulus signals are precomputed before the model is used in measurements. For example, this optimization can be used to compute a figure of merit such as Power Spectral Density (PSD) from a very small data set using parametric spectral estimation instead of traditional non-parametric methods based on a Fast Fourier Transform (FFT). In an amplifier with a static cubic distortion, input signal u(t) generates output signal y(t)=a*u(t)+b*u^3(t), in which parameters a and b are computed from first subsets 104a and 103a respectively of measured input data {u_1, u_2, ..., u_n} and corresponding output data {y_1, y_2, ..., y_n}. These measured data pairs can be collected together as an array {(u_i, y_i)} In a more general case, y(t) includes functions of other powers of u(t) and/or derivatives of u(t). Details of parametric model development are described for example in Usikov, "Behavioral Modeling of Nonlinear Systems," pp. 1–73 (Aug. 10, 1999), which have been incorporated herein by reference. Power Spectral Density S(v) can be defined as $$S(v) \equiv \langle |X(v)|^2 \rangle = \langle X(v)X^*(v) \rangle \quad (1)$$

where X(v) is the Fourier transform and star * denotes complex conjugate, $$X(v) \equiv T \xrightarrow{\lim} \infty \frac{1}{T} \int_{-\frac{T}{2}}^{\frac{T}{2}} e^{i2v\tau} y(t) dt. \quad (2)$$

Accordingly, $$S(v) = T \xrightarrow{\lim} \infty \frac{1}{T} \int_{-\frac{T}{2}}^{\frac{T}{2}} e^{i2v\tau} y(t) dt \int_{-\frac{T}{2}}^{\frac{T}{2}} e^{-2iv\tau} y(\tau) d\tau, \quad (3)$$

or since $y(t) = a*u(t) + b*u^3(t)$, then $$S(v) = \frac{\lim}{T \to \infty} \frac{1}{T} \int_{-\frac{T}{2}}^{\frac{T}{2}} e^{i2v\tau}(a*u(t) + b*u^3(t)) dt \int_{-\frac{T}{2}}^{\frac{T}{2}} e^{-2iv\tau}(a*u(\tau) + b*u^3(\tau)) d\tau. \quad (4)$$

Defining $$I_1 \equiv \int_{-\frac{T}{2}}^{\frac{T}{2}} u(t) e^{i2v\tau} dt; \; I_3 \equiv \int_{-\frac{T}{2}}^{\frac{T}{2}} u(\tau) e^{-2iv\tau} d\tau; \quad (5a)$$

$$I_2 \equiv \int_{-\frac{T}{2}}^{\frac{T}{2}} u^3(t) e^{i2v\tau} dt; \; I_4 \equiv \int_{-\frac{T}{2}}^{\frac{T}{2}} u^3(\tau) e^{-2iv\tau} d\tau; \quad (5b)$$

then: (6)

$$S(v) = T \xrightarrow{\lim} \infty \frac{1}{T} [(aI_1 + bI_2)*(aI_3 + bI_4)]$$

$$= T \xrightarrow{\lim} \infty \frac{1}{T} [a^2 I_1 I_3 + abI_1 I_4 + abI_2 I_3 + b^2 I_2 I_4]$$

Since u(t) is known beforehand and is fixed for a given test procedure, all the integrals $I_1$, $I_2$, $I_3$, $I_4$ can be precomputed either numerically or analytically. To compute the PSD, all that is needed is to know "a" and "b" for a given behavioral model. A least squares fit of parameters a and b is sufficient to rapidly calculate the PSD, if the input signal is known beforehand.

To find model parameters a, b, minimize least squares error $$E^2(y_p, y_i, a, b) = \sum_{i=1,N} (y_p - y_i)^2 \qquad (7)$$

$$= \sum_{i=1,N} (au_i + bu_i^3 - y_i)^2$$

$$= \sum_{i=1,N} (a^2 u_i^2 + 2abu_i^4 + b^2 u_i^6 - 2au y_i - 2bu_i^3 y_i + y_i^2),$$

where $y_p(t)$ is predicted time series and $y_i(t)$ is measured time series.

To find a and b, minimize error function $E^2$ with respect to a and b, i.e., $$\frac{\partial E^2}{\partial a} = 0; \qquad (8a)$$

$$2a \sum u_i^2 + 2b \sum u_i^4 - 2 \sum u_i y_i$$

$$a \sum u_i^2 + b \sum u_i^4 = \sum y_i u_i;$$

$$\frac{\partial E^2}{\partial b} = 0; \qquad (8b)$$

$$2a \sum u_i^4 + 2b \sum u_i^6 - 2 \sum u_i^3 y_i = 0;$$

$$a \sum u_i^4 + b \sum u_i^6 = \sum u_i^3 y_i.$$

Note equations (8a, 8b) are linear in a and b. With 2 equations and 2 unknowns, a, b can be calculated with just two data pairs $\{(u_1, y_1),(u_2, y_2)\}$, using various mathematical methods, for example matrix algebra $$\begin{bmatrix} \sum u_i^2 & \sum u_i^4 \\ \sum u_i^4 & \sum u_i^6 \end{bmatrix} \times \begin{bmatrix} a \\ b \end{bmatrix} = \begin{bmatrix} \sum y_i u_i \\ \sum u_i^3 y_i \end{bmatrix}; \qquad (7)$$

A b=C;

⇒b=A⁻¹C;

or in Matlab language $$b = A \backslash C \qquad (9)$$

Typically the problem is over-determined (more $(u_i, y_i)$'s than (a, b)'s), and the matrix inverse $A^{-1}$ actually calculated is a Penrose pseudo inverse by Singular Value Decomposition (SVD) [see for example Gregorcic, "Singular Value Decomposition—SVD," University College Cork, Ireland, pp. 1–7, Aug. 1, 2001; "The Pseudo Inverse," P. 1, http://www.imm.dtu.dk/_mj/MscProject/node18.html; and "Pseudoinverse," p. 1, http://ikpe1101.ikp.kfa-juelich.de/briefbook_data_analysis/node220.html, Oct. 1, 2002]. For simple examples, $(u_i, y_i)$ is same dimension as (a, b)'s, such that an exact inverse can be calculated. Alternatively, Kalman filtering methods (see for example Haykin, "Kalman Filtering and Neural Networks, John Wiley & Sons, 2001), including variants (e.g., Extended Kalman filtering, Dual Kalman filtering, and Unscented Kalman filtering) are used for parameter estimation. A significant difference between SVD and Kalman filtering operation is that the Kalman filter and its variants employ iterative techniques rather than batch processing techniques employed in SVD. This has particular importance in a manufacturing line environment, where memory and test time constraints are more acute than in laboratory experimentation. The Kalman filter is much more amenable to hardware implementation in instrument FPGA than is the SVD, even though both achieve similar results.

After the behavioral model is optimized by precomputing all nonlinear terms that depend on nonlinear combinations of the stimulus signals, at step 209 the optimized model is applied to figure of merit measurements of an intended nonlinear device, for example an amplifier in a manufacturing line. Preferably, verification step 207 is repeated at intervals to determine whether new measured output data are in agreement with output data predicted by behavioral model G(·).

Thus, there are disclosed methods for extraction of a behavioral model of a nonlinear device from embeddings of time-series of sampled and measured input and output signals utilizing prespecified input signals of a type normally produced by currently available and/or future signal sources and analyzers. The model fitting procedure is optimized to predict figures of merit accurately based on a short stimulus vector, which allows a precomputed model structure to be estimated using a very short excitation vector. The required dimensionality of the stimulus vector is typically more than two orders of magnitude smaller than that currently required for standard test equipment. These shorter test vectors can be used to reduce overall test time or increase measurement resolution, or both. These methods are particularly attractive for test equipment to be used in a manufacturing test environment, where it is expected that there is sufficient data to estimate an accurate model structure before or during the process of setting up a large-scale production line. Preferably, verification step 207 is repeated at intervals to determine whether new measured output date continue to agree sufficiently with output data predicted by behavioral model fitted function G(·). This comparison can be conducted on a sub-sampling DUT basis and can be used to adjust the behavioral model fitted function G(·) and to compare figures of merit obtained using nonlinear modeling with those obtained using conventional measurement techniques.

One embodiment of these methods estimates the PSD of a HP power amplifier using an Agilent E4432B signal source and Agilent E4440A performance spectrum analyzer. In this illustrative example, the signal source is a CDMA 2000 stimulus vector consisting of I and Q channels. To estimate PSD with a FFT based conventional method currently used in the performance spectrum analyzer E4440A, where as many as 100,000 stimulus data samples are used. By comparison, using methods in accordance with embodiments of the present invention, only 4000 stimulus data samples are sufficient to estimate the PSD. Matlab code documents the use of these methods in this particular embodiment (see Hanselman et al., 2000, cited above; see also Usikov, 1999, cited above and incorporated herein by reference).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of estimating a figure of merit for a nonlinear device under test, comprising:
    developing from a first sub-sampling of input signals and corresponding output signals for said device a nonlinear behavioral model fitted mathematical function for said device containing terms depending on linear and nonlinear combinations of said input signals and linearly on a set of parameter coefficients;
    deriving from said nonlinear behavioral model fitted mathematical function a figure of merit having terms depending on linear and nonlinear combinations of said input signals and linearly on a set of parameter coefficients;
    before said nonlinear behavioral model is applied, pre-computing in advance for a substantially fixed value of said input signal all terms in said nonlinear model that depend on nonlinear combinations of said input signals; and
    evaluating said parameter coefficients, such that said nonlinear behavioral model is optimized.

2. The method of claim 1 wherein said nonlinear behavioral model fitted mathematical function contains terms depending on linear and nonlinear combinations of said input signals and/or time derivatives of said input signals.

3. The method of claim 2 further comprising applying said optimized nonlinear behavioral model to estimate a figure of merit for a plurality of said nonlinear devices using a second sub-sampling of said input signal having said substantially fixed value for all of said plurality of said nonlinear devices.

4. The method of claim 2 further comprising before said nonlinear behavioral model is applied verifying said nonlinear behavioral model using a third sub-sampling of said input signals and corresponding output signals.

5. The method of claim 3 wherein said optimized nonlinear behavioral model is continually verified and adjusted using a fourth sub-sampling of said input signals and corresponding output signals.

6. The method of claim 2 wherein said nonlinear behavioral model fitted mathematical function is fitted to an embedded data set.

7. The method of claim 6 wherein said embedded data set is embedded using a method selected from the group consisting of lagged embedding, singular value decomposition, and wavelet decomposition individually and in combination.

8. The method of claim 6 wherein said behavioral model fitted mathematical function is fitted to said embedded data set using a method selected from the group consisting of least squares fit, least squares fit with multivariate polynomials, radial basis functions, neural networks, universal function approximation, and local linear modeling.

9. The method of claim 2 wherein said parameter coefficients are evaluated using operations selected from the group consisting of Kalman filtering, variants of Kalman filtering, and matrix algebra operations.

10. The method of claim 9 wherein said matrix algebra operations comprise pseudoinverse matrices and/or singular value decomposition.

11. The method of claim 2 wherein said figure of merit is selected from the group consisting of correlation coefficient ($\rho$), error vector magnitude, adjacent channel power ratio, third-order intermodulation distortion, and power spectral density.

12. A system for estimating a figure of merit for a nonlinear device under test, comprising:
    an excitation signal generating module operable to apply a plurality of input signals to an input port of said nonlinear device;
    a data acquisition module operable to sample said plurality of input signals and to measure a plurality of output signals generated by said nonlinear device in response to said plurality of input signals; and
    a signal processing computer operable to create from a sub-sampling of said plurality of input and output signals an embedded data set and further operable to fit a nonlinear behavioral model function to said embedded data set, and operable to compute at least one figure of merit using said nonlinear behavioral model function.

13. The system of claim 12 wherein said signal processing computer is operable to create said embedded data set using a method selected from the group consisting of lagged embedding, singular value decomposition, and wavelet decomposition individually and in combination.

14. The system of claim 12 wherein said signal processing computer is operable to fit said nonlinear behavioral model function using a method selected from the group consisting of least squares fit, least squares fit with multivariate polynomials, radial basis functions, neural networks, universal function approximation, and local linear modeling.

15. The system of claim 12 wherein said nonlinear behavioral model function contains terms depending on parameter coefficients and on linear and nonlinear combinations of said input signals and/or time derivatives of said input signals.

16. The system of claim 15 wherein said signal processing computer is operable to evaluate said parameter coefficients using operations selected from the group consisting of Kalman filtering, variants of Kalman filtering, and matrix algebra operations.

17. The system of claim 16 wherein said matrix algebra operations comprise pseudoinverse matrices and/or singular value decomposition.

18. The system of claim 12 wherein said figure of merit is selected from the group consisting of correlation coefficient ($\rho$), error vector magnitude, adjacent channel power ratio, third-order intermodulation distortion, and power spectral density.

19. A system for estimating a figure of merit for a nonlinear device under test, comprising:
    an excitation signal generating module operable to apply a plurality of input signals to an input port of said nonlinear device;
    a data acquisition module operable to sample said plurality of input signals and to measure a plurality of output signals generated by said nonlinear device in response to said plurality of input signals; and
    a signal processing computer operable to create from a sub-sampling of said plurality of input and output signals an embedded data set and further operable to fit a nonlinear behavioral model function to said embedded data set, wherein said function contains terms depending on parameter coefficients and on linear and nonlinear combinations of said input signals and/or time derivatives of said input signals.

20. The system of claim 19 wherein said signal processing computer is operable to evaluate said parameter coefficients using operations selected from the group consisting of Kalman filtering, variants of Kalman filtering, and matrix algebra operations.

* * * * *

UNITED STATES PATENT AND TRADEMARK OFFICE
CERTIFICATE OF CORRECTION

PATENT NO.     : 6,892,155 B2
DATED          : May 10, 2005
INVENTOR(S)    : Gee et al.

It is certified that error appears in the above-identified patent and that said Letters Patent is hereby corrected as shown below:

Title page,
Item [56], References Cited, OTHER PUBLICATIONS,
"Agilent PSA Series Spectrum Analyzers," reference, delete "Aglient" and insert
-- Agilent --.

Signed and Sealed this

Twentieth Day of December, 2005

JON W. DUDAS
*Director of the United States Patent and Trademark Office*